United States Patent [19]

Asami

[11] 4,437,072

[45] Mar. 13, 1984

[54] LOCK DETECTING CIRCUIT FOR PHASE-LOCKED LOOP FREQUENCY SYNTHESIZER

[75] Inventor: Fumitaka Asami, Kunitachi, Japan

[73] Assignee: Fujitsu Limited, Kawasaki, Japan

[21] Appl. No.: 420,633

[22] Filed: Sep. 21, 1982

Related U.S. Application Data

[63] Continuation of Ser. No. 179,898, Aug. 20, 1980, abandoned.

[30] Foreign Application Priority Data

Aug. 23, 1979 [JP] Japan .................................. 54-107392

[51] Int. Cl.³ .............................................. H03L 7/18
[52] U.S. Cl. ...................................... 331/1 A; 331/17; 331/25; 331/DIG. 2
[58] Field of Search ............. 331/1 A, 17, 25, DIG. 2

[56] References Cited

U.S. PATENT DOCUMENTS

| | | | |
|---|---|---|---|
| 3,982,190 | 9/1976 | Schaefer | 328/110 |
| 4,122,405 | 10/1978 | Tietz et al. | 331/1 A |
| 4,290,029 | 9/1981 | Streckenbach | 331/1 A |

OTHER PUBLICATIONS

Akiyama et al., "PLL IC Capable of Direct Division of FM Local Oscillator Frequency", IEEE Transactions on Consumer Electronics, vol. CE-26, Feb. 1980, pp. 36-41.

Blatter et al., "Frequency Synthesis Custon LSI: The Inside Story", IEEE Transactions on Consumer Electronics, vol. CE-24, Aug. 1978, pp. 429-434.

Sharpe, "How can you be sure that your PLL is really locked in?", Electronic Design News, vol. 22, Feb. 20, 1977, pp. 109-111.

European Published Patent Application No. 0,012,899, Published Jul. 9, 1980, Inventor: Streckenbach, (Equivalent to U.S. Pat. No. 4,290,029).

Primary Examiner—Siegfried H. Grimm
Attorney, Agent, or Firm—Staas & Halsey

[57] ABSTRACT

A phase-locked loop circuit comprising a reference oscillator (1), a reference frequency divider (2) for dividing the output signal of the reference oscillator, a programmable frequency divider (3), a phase comparator (4) for monitoring the difference in phase between the output signal of the two frequency dividers, a lock detector (11) for generating a first signal which is pulse-shaped or rectangular when the above-mentioned difference in phase is generated, and a digital signal maintaining circuit (100) for converting the first signal into a second directed current signal.

12 Claims, 27 Drawing Figures

LOCK DETECTING CIRCUIT FOR PHASE-LOCKED LOOP FREQUENCY SYNTHESIZER

This is a continuation application of Ser. No. 179,898, filed Aug. 20, 1980, and now abandoned.

BACKGROUND OF THE INVENTION

The present invention relates generally to a phase-locked loop circuit and, more particularly, to a phase-locked loop circuit which is suitable for a frequency synthesizer for obtaining desired oscillating frequencies.

In general, a phase-locked loop circuit comprises a reference oscillator including a crystal resonator, a phase comparator, a low-pass filter and a voltage controlled oscillator. The phase comparator detects the difference in phase between a reference oscillating signal generated from the reference oscillator and a oscillating signal generated from the voltage controlled oscillator. The output voltage of the phase comparator is smoothed by the low-pass filter, and the smoothed voltage serves as a control voltage for the voltage controlled oscillator and, accordingly, the phase of the oscillating signal from the voltage controlled oscillator bexomes the same as that of the reference oscillating signal.

In order to obtain a desired oscillating frequency, a l/n frequency divider is provided between the voltage controlled oscillator and the phase comparator in the above-mentioned phase-locked loop circuit. The l/n frequency divider is usually called a programmable frequency divider, since the frequency division ratio of the divider is controlled by an external signal. In this case, an output frequency $f_s$ is n times a reference oscillating frequency $f_r$. That is, such a phase-locked loop circuit serves as a frequency synthesizer and, accordingly, an output signal of the voltage controlled oscillator is used for controlling a local oscillator of a receiver, such as a ratio, a reference oscillator of a transceiver or the like. In such a phase-locked loop circuit, in order to prevent noise from being generated in the radio or the transceiver when the phase-locked loop is out of lock, a muting circuit is provided in the radio or the transceiver.

In the prior art, in order to control the muting circuit, a lock detector is connected to the phase comparator and, in addition, an integrator circuit is connected to the lock detector. The integrator circuit converts a pulsed (rectangular wave) lock detecting signal into a direct current lock detecting signal which is used for controlling the muting circuit.

However, in the above-mentioned prior art, since an integrator circuit is used for converting the pulsed lock detecting signal into a direct current lock detecting signal, a semiconductor phase-locked loop device adapted for generating a direct current lock detecting signal, in which the reference oscillator, the programmable frequency divider, the phase comparator and the lock detector are integrated, requires external components. In addition, such a semiconductor device requires a large number of external terminals. Further, the rising and falling speed of the direct current lock detecting signal is slow and unstable.

SUMMARY OF THE INVENTION

It is an object of the present invention to provide a phase-locked loop circuit, for producing a direct current lock detecting signal, requiring no external components and with a small number of external terminals.

It is another object of the present invention to provide a phase-locked loop circuit for stably producing a direct current lock detecting signal with a high speed.

It is still another object of the present invention to provide a phase-locked loop circuit in which the potential of a direct current lock detecting signal remains low for a definite time after phase reacquisition.

According to the present invention, there is provided a phase-locked loop circuit comprising: a reference oscillator; a reference frequency divider, connected to the reference oscillator, for dividing the output signal of the reference oscillator; a programmable frequency divider; a phase comparator, connected to outputs of the programmable frequency divider and the reference frequency divider, for monitoring the difference in phase therebetween; a lock detector, connected to outputs of the phase comparator, for generating a first lock detecting signal which is pulsed (rectangular wave), when a difference in phase is detected; and a digital signal maintaining circuit, connected to outputs of the phase comparator and the reference frequency divider, for converting the first lock detecting signal into a second lock detecting signal which is a direct current level, and for maintaining the second lock detecting signal for a definite time after the first lock detecting signal is extinguished.

BRIEF DESCRIPTION OF THE DRAWINGS

The present invention will be more clearly understood from the description as set forth below with reference to the accompanying drawings wherein:

FIG. 5 is a logic circuit diagram of the digital signal maintaining circuit 100 of FIG. 4; and FIGS. 6A through 6K and FIGS. 7A through 7K are timing diagrams of the signals appearing in the circuits of FIGS. 4 and 5.

DESCRIPTION OF THE PREFERRED EMBODIMENTS

Figure 1:
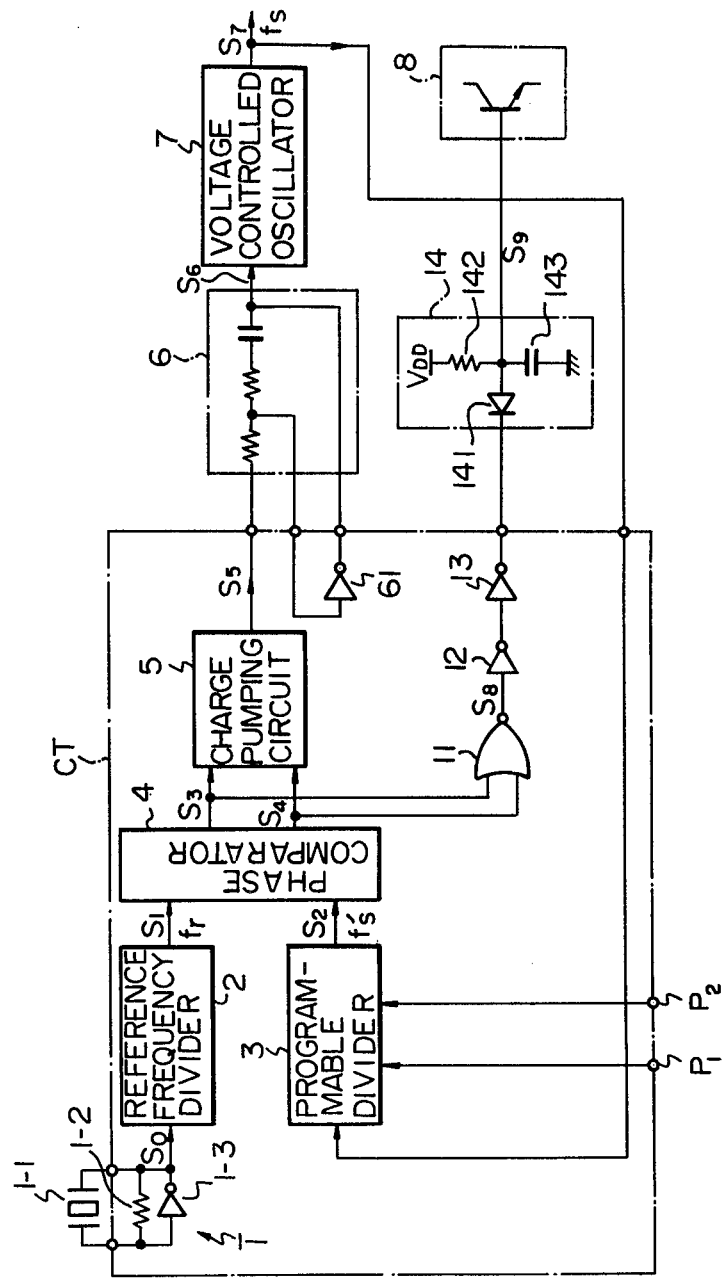
FIGS. 1 through 3 are block diagrams of conventional phase-locked loop circuits.

In FIG. 1, which illustrates a conventional phase-locked loop circuit which serves as a frequency synthesizer, a signal $S_0$ generated from a reference oscillator 1, which is comprised of a crystal resonator 1-1, a resistor 1-2 and an inverter 1-3, is converted into a reference signal $S_1$ by a reference frequency divider 2. A programmable frequency divider 3 converts a signal $S_7$ into a signal $S_2$, which corresponds to the reference signal $S_1$. If the ratio of division of the programmable frequency divider 3 is n, the frequency $f_s$ of the signal $S_7$ and the frequency $f_s'$ of the signal $S_2$ satisfy the following formula.

$$f_s' = f_s/n$$

In such a case, the ratio n is controlled by supplying signals to program terminals $P_1$ and $P_2$ of a digital circuit CT. The phase comparator 4 detects the difference in phase between the reference signal $S_1$ and the signal $S_2$ generated from the programmable frequency divider 3. For example, when the signal $S_2$ lags the reference signal $S_4$, the phase comparator 4 generates a pulsed signal $S_3$, while, when the signal $S_2$ leads the reference signal $S_1$, the phase comparator generates a pulsed signal $S_4$. The signals $S_3$ and $S_4$ are converted into a three-value signal $S_5$ by a charge pumping circuit 5 and, after that, the signal $S_5$ is smoothed by a low-pass filter 6, which includes an inverter 61 of the circuit CT. The resulting signal $S_6$ serves as a control signal for the voltage controlled oscillator 7, whose output signal $S_7$ is supplied to the programmable frequency divider 3. That is, the programmable frequency divider 3, the phase comparator 4, the charge pumping circuit 5, a low-pass filter and the voltage controlled oscillator 7 form a phase-locked loop.

The signal $S_7$ of the voltage controlled oscillator 7 is used for controlling a local oscillator (not shown) of a receiver. When the signal $S_2$ is out of phase with the reference signal $S_1$, the frequency of a signal received by the receiver becomes different from the desired frequency, so that noise is generated in the speaker (not shown) of the receiver. In order to avoid such noise, a muting circuit 8 is provided within the receiver. In the prior art, in order to control the muting circuit 8, the phase comparator 4 is connected to a lock detector 11, comprised of a NOR gate, whose output signal $S_8$ is supplied through two inverters 12 and 13 to an integrator circuit 14, which is comprised of a diode 141, a resistor 142 and a capacitor 143. When the signal $S_2$ is out of phase with the reference signal $S_1$, the lock detector 11 generates a pulsed (rectangular wave) lock detecting signal $S_8$, which is converted into a direct current lock detecting signal $S_9$, which is supplied to the muting circuit 8. In the circuit of FIG. 1, such an analog signal process using the integrator circuit 14 requires external components, such as a diode, a resistor and a capacitor, and in addition, the rise and fall speed of the lock detecting signal is slow and unstable. It should be noted that all the components within the circuit CT can be manufactured as an integrated semiconductor device, since the components are digital components.

Figure 2:
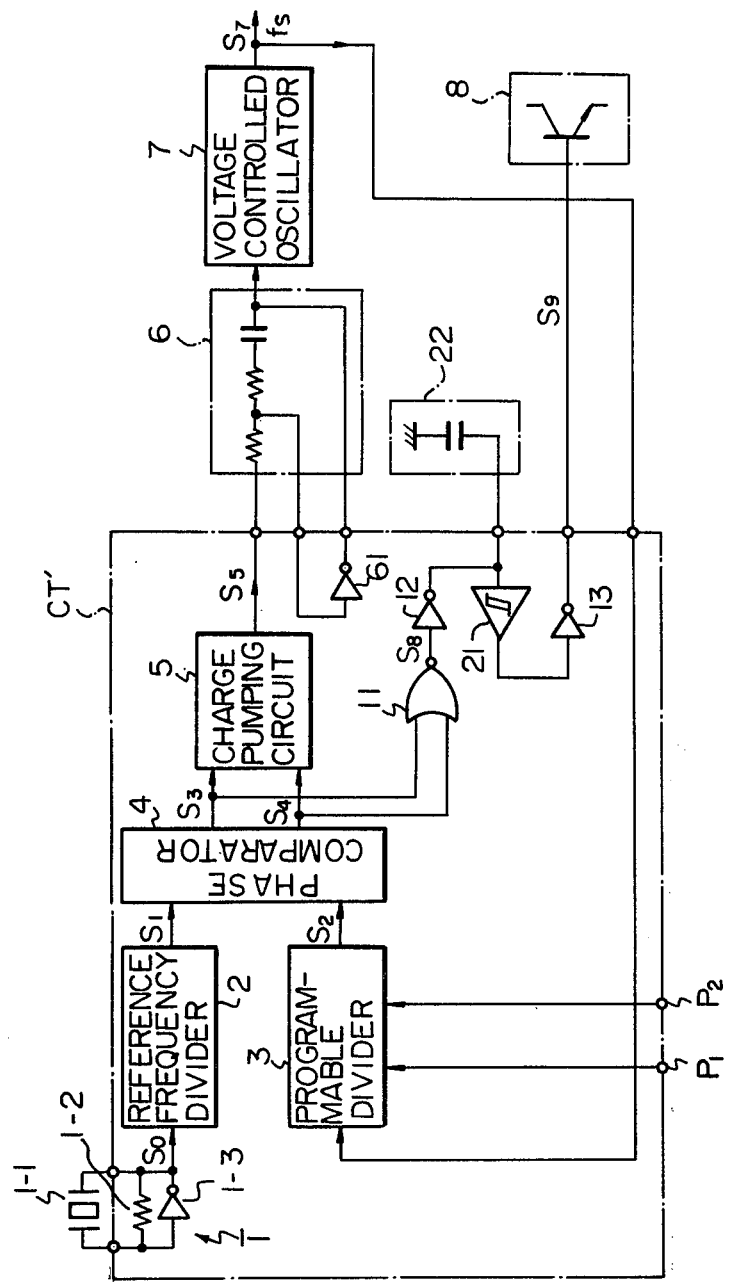

FIG. 2 illustrates another conventional phase-locked loop circuit which also serves as a frequency synthesizer. The elements in FIG. 2 which are identical to those of FIG. 1 are denoted by the same reference numerals. In FIG. 2, a Schmitt trigger circuit 21 is incorporated in a digital circuit CT' and an integrator circuit 22 is provided outside of the circuit CT'. When the lock detector 11 generates a pulsed lock detecting signal $S_8$, the input potential of the Schmitt trigger circuit 21 is raised by the integrator circuit 22 which, in turn, generates a high potential signal. Therefore, the potential of the signal $S_9$ becomes low. However, even in the circuit of FIG. 2, since the integrator circuit 22 is used for converting the pulsed lock detecting signal $S_8$ into the direct current lock detecting signal $S_9$, external components are required, and in addition, the rise and fall speed of the lock detecting signal $S_9$ is slow and unstable. Further, since the digital circuit CT' has a larger number of external terminals than the digital circuit CT of FIG. 1, the number of pins of the circuit CT' is large when the circuit CT' is manufactured as one semiconductor device.

Figure 3:
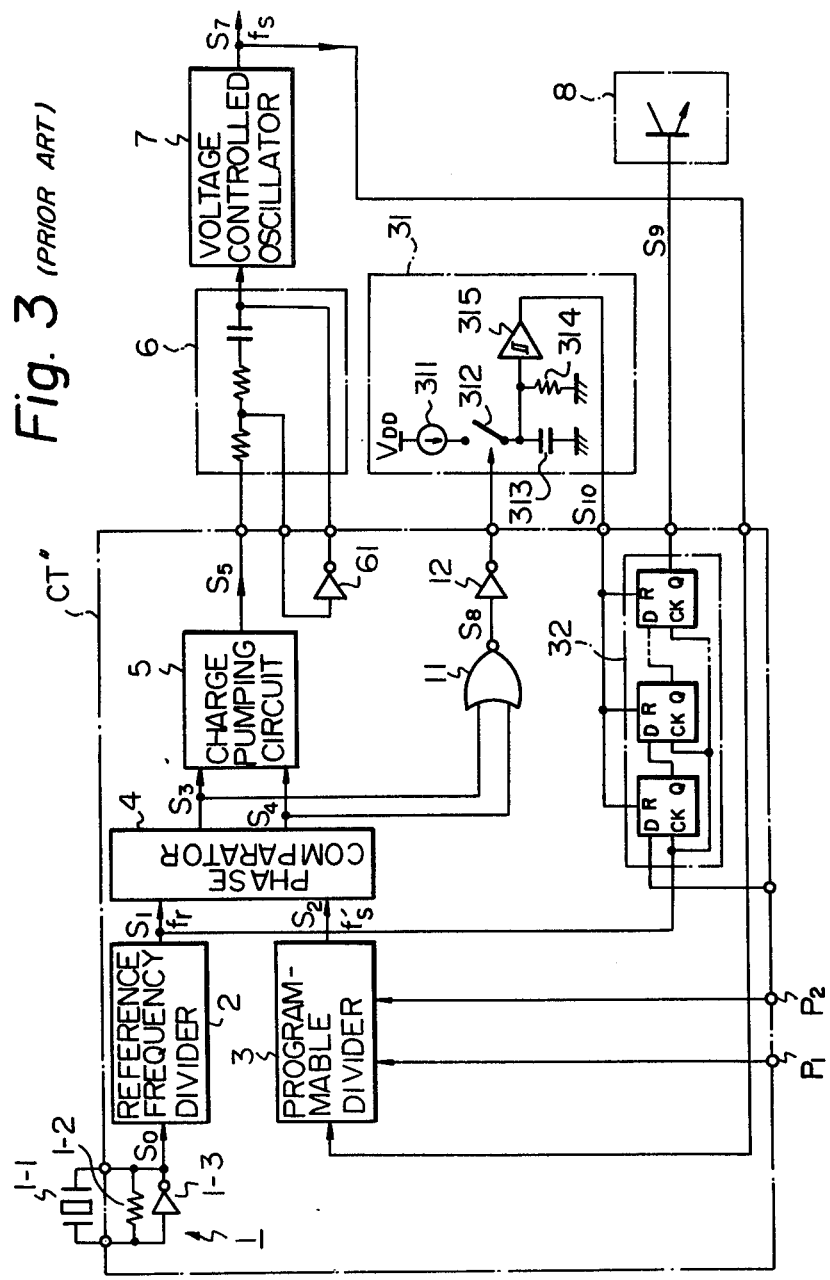

FIG. 3 illustrates still another conventional phase-locked loop circuit which serves as a frequency synthesizer (see: U.S. Pat. No. 4,122,405). The elements in FIG. 3 which are identical to those of FIG. 1 are denoted by the same reference numerals. A pulse width discriminator circuit 31 is provided outside of a digital circuit CT'', and a lock discriminator circuit 32, comprised of a plurality of D flip-flops connected in series, is incorporated into the circuit CT''. The pulse width discriminator circuit 31 comprises a current source 311, a switch 312, a capacitor 313 and a resistor 314 which serve as an integrator circuit, and a Schmitt trigger circuit 315. When the lock detector 11 generates a pulsed lock detecting signal $S_8$, the switch 312 is turned on or off in response to the potential of the signal $S_8$, so that current is supplied from the current source 311 to the integrator circuit. As a result, the input potential of pins of the Schmitt trigger circuit 315 is raised and, accordingly, a reset signal $S_{10}$ is supplied to all the D flip-flops of the lock discriminator circuit 32. As a result, the potential of the signal $S_9$ is changed from high to low. In addition, even when the out-of lock state between the signal $S_2$ and the reference signal $S_1$ is extinguished, the potential of the signal $S_9$ remains low for a definite time, which is determined by the number of stages of the D flip-flops. However, even in the circuit of FIG. 3, since the pulse width discriminator circuit 31 including an integrator circuit is used for converting the pulsed or lock detecting signal $S_8$ into the direct current lock detecting signal $S_9$, a large number of external components are required. In addition, the rise and fall speed of the lock detecting signal $S_9$ is slow and unstable. Further, since the digital circuit CT'' has a larger number of external terminals than the circuit CT of FIG. 1, the number of pins of the circuit CT'' is large when the circuit CT'' is manufactured as one semiconductor device.

Contrary to above, in the present invention, in order to convert the pulsed lock detecting signal $S_8$ into the direct current lock detecting signal $S_9$, a circuit performing a digital operation upon signals is used instead of an integrator circuit.

Figure 4:
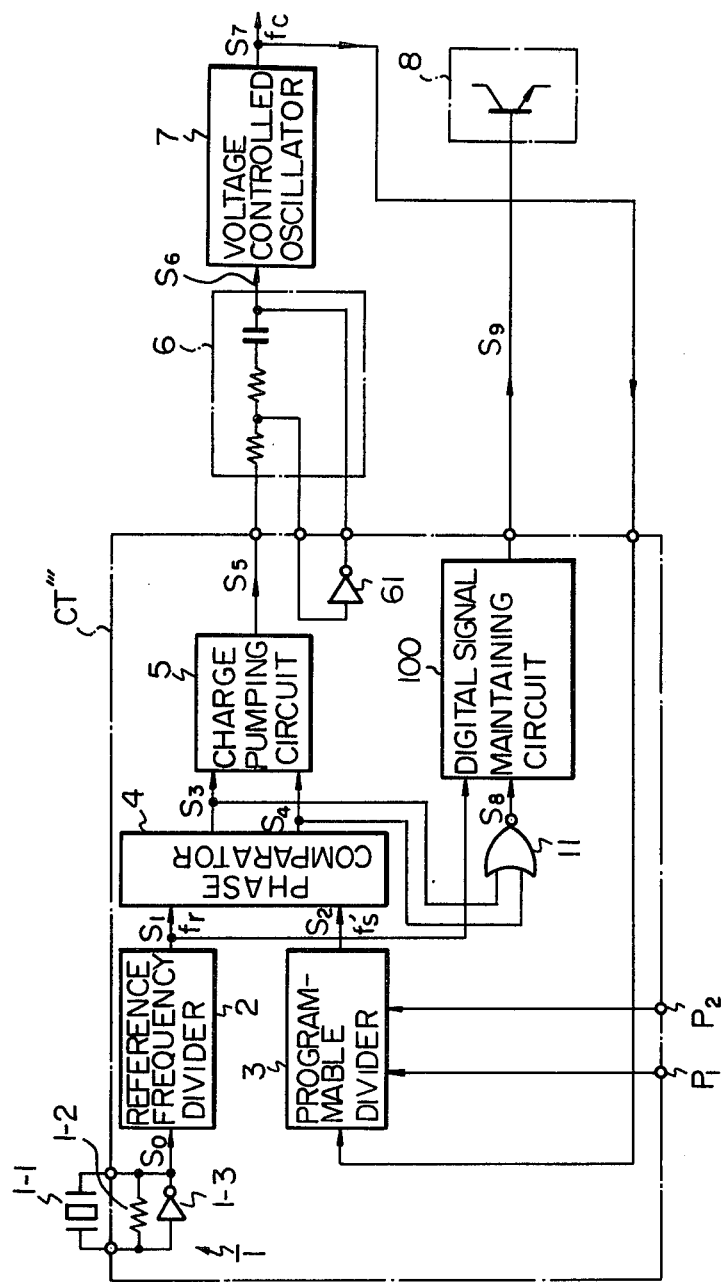
FIG. 4 is a block diagram of an embodiment of the phase-locked loop circuit according to the present invention.

FIG. 4 is a block diagram illustrating an embodiment of the phase-locked loop circuit according to the present invention. The elements in FIG. 4 which are identical to those of FIG. 1 are denoted by the same reference numerals. Referring to FIG. 4, a digital signal maintaining circuit 100, whose output is connected to the muting circuit 8, is incorporated in a digital circuit CT''''. The digital signal maintaining circuit 100 converts a pulse-shaped or rectangular lock detecting signal $S_8$ into a direct current lock detecting signal $S_9$. Since the circuit 100 includes no integrator circuit, the circuit 100 requires no external component, and in addition, the fall speed of the signal $S_9$ is high and stable. Further, even when the out-of lock state between the signal $S_2$ and the reference signal $S_1$ is extinguished, the circuit 100 maintains the low potential of the signal $S_9$ for a definite time. Furthermore, since the circuit CT'''' has a smaller number of external terminals than the circuit CT' of FIG. 2 or the circuit CT'' of FIG. 3, the number of pins of the circuit CT'' is small when the circuit CT'''' is manufactured as one semiconductor device. Hereinafter, the digital signal maintaining circuit 100 will be explained in more detail.

FIG. 5 is a logic circuit diagram of the digital signal maintaining circuit 100 of FIG. 4. In FIG. 5, the digital signal maintaining circuit 100 comprises two flip-flops 101 and 102 which serve as a quaternary counter (two-digit binary counter), two cross-coupled NAND gates 103 and 104 which serve as a latch circuit, two D-flip-fips 105 and 106 which serve as registers, a NAND gate 107 connected to the output of the lock detector 11 (FIG. 4), to the output of the NAND gate 103, and to non-inverting outputs of the flip-flops 105 and 106, and an inverter 108 connected to the output of the NAND gate 107.

The quaternary counter formed by the flip-flops 101 and 102 is triggered by the fall of the reference signal $S_1$ when the potential of the signal $S_8$ is high, in other words, when the signal $S_2$ is in phase with the reference signal $S_1$. On the other hand, the counter is reset by the fall of the reference signal $S_1$ when the potential of the signal $S_8$ is low. In this case, the potential of an output Q of the flip-flop 101 remains low, while the potential of an output $\overline{Q}$ of the flip-flop 102 remains high.

In the latch circuit formed by the NAND gates 103 and 104, there are two states, that is, a first state wherein the output potentials of the NAND gates 103 and 104 are low and high, respectively, and a second state wherein the output potentials of the NAND gates 103 and 104 are high and low, respectively. The state of the latch circuit is changed from the first state to the second state when the potentials of the signals $S_{12}$ and $S_8$ are low and high, respectively. Contrary to this, the state of the latch circuit is changed from the second state to the first state when the potentials of the signals $S_{12}$ and $S_8$ are high and low, respectively.

The D-flip-flop 105, which serves as a register, is triggered by the fall of the signal $S_1$ when the latch circuit is in the second state. In addition, the D-flip-flop 106, which also serves as a register, is triggered by the fall of the signal $S_1$ after the D-flip-flop 105 is triggered. Therefore, the signals $S_{13}$, $S_{14}$ and $S_{15}$ are changed, in order, by the D-flip-flops 105 and 106.

The operation of the circuit of FIG. 4 and the digital signal maintaining circuit 100 will be now explained in detail.

FIGS. 6A through 6K are timing diagrams of the signals appearing in the circuits of FIGS. 4 and 5, wherein the signal $S_2$ leads the reference signal $S_1$. Referring to FIGS. 6A through 6K, before a time $t_1$ and after a time $t_4$, the reference signal $S_1$ (FIG. 4), as illustrated in FIG. 6A, is in phase with a signal $S_2$ (FIG. 4), as illustrated in FIG. 6B, so that the potentials of the signals $S_3$ and $S_4$ are low, as illustrated in FIGS. 6C and 6D. Therefore, the potential of the signal $S_8$ remains high, as illustrated in FIG. 6E. In this case, the counter formed by the flip-flops 101 and 102 performs a counting operation, as illustrated in FIGS. 6F and 6G. At a time $t_1$ when the signal $S_2$ leads the reference signal $S_1$, the signal $S_4$ becomes a series of pulses, as illustrated in FIG. 6D. In addition, the signal $S_8$ becomes an inverted signal of the signal $S_4$, as illustrated in FIG. 6E. The flip-flops 101 and 102 are reset by the fall of the signal $S_8$, and accordingly, the potentials of the signals $S_{11}$ and $S_{12}$ become low and high, respectively, as illustrated in FIGS. 6F and 6G. As a result, the latch circuit formed by the NAND gates 103 and 104 is inverted, as illustrated in FIG. 6H. The output signal $S_{13}$ of the latch circuit through the NAND gate 107 and the inverter 108 enables the potential of the signal $S_9$ to change from high to low. Therefore, when the signal $S_2$ becomes out of phase with the reference signal $S_1$, the muting circuit 8 begins to operate immediately. Since the potential of the data input D of the D-flip-flop 105 has changed from high to low at a time $t_2$, the D-flip-flop 105 is inverted by the next fall of the reference signal $S_1$, as illustrated in FIG. 6I. That is, the potential of the data input D of the D-flip-flop 106 is changed from high to low, and thus the D-flip-flop 106 is inverted at a time $t_3$ by the next fall of the reference signal $S_1$, as illustrated in FIG. 6J.

Even at a time $t_4$ when the signal $S_2$ becomes in phase with the reference signal $S_1$, the potential of the signal $S_9$ remains low. At a time $t_5$ the counter performs a counting operation again, as illustrated in FIGS. 6F and 6G. As a result, at a time $t_6$, since the potentials of the signals $S_{12}$ and $S_8$ become low and high, respectively, the latch circuit is inverted, as illustrated in FIG. 6H. In other words, the potential of the data input D of the D-flip-flop 105 is changed from low to high and, accordingly, at a time $t_7$ the D-flip-flop 105 is inverted by the next fall of the reference signal $S_1$, as illustrated in FIG. 6I. That is, the potential of the data input D of the D-flip-flop 106 is changed from low to high and, accordingly, at a time $t_8$ the D-flip-flop 106 is inverted by the next fall of the reference signal $S_1$, as illustrated in FIG. 6J. Thus, at a time $t_8$ when the potentials of all the signals $S_8$, $S_{13}$, $S_{14}$ and $S_{15}$ are high, the output potential of the NAND gate 107 is changed from high to low, so that the potential of the output signal $S_9$ of the inverter 108 is changed from low to high, as illustrated in FIG. 6K.

As explained above, when the signal $S_2$ becomes out of phase with the reference signal $S_1$, the potential of the signal $S_9$ is changed from high to low, immediately. Contrary to this, when the signal $S_2$ becomes in phase with the reference signal $S_1$, the potential of the signal $S_9$ remains low for a definite time $4\tau$ (where $\tau$ is the period of the reference signal $S_1$), and after that, the potential of the signal $S_9$ is changed from low to high.

FIGS. 7A through 7K are timing diagrams of the signals appearing in the circuits of FIGS. 4 and 5, wherein two successive out-of phase phenomena are generated. In this case, in the circuit of FIG. 4, such two successive out-of-phase phenomena are treated as one out-of-phase phenomenon. As illustrated in FIGS. 7A and 7B, at a time $t_1'$ the signal $S_2$ becomes in phase with the reference signal $S_1$. After a time T has passed, at a time $t_2'$ the signal $S_2$ lags the reference signal $S_1$, so that the signal $S_3$ becomes pulsed, as illustrated in FIG. 7C. Therefore, the signal $S_8$ becomes an inverted signal of the signal $S_3$, as illustrated in FIG. 7E, since the potential of the signal $S_4$ remains low. The flip-flops 101 and 102 are reset by the fall of the signal $S_8$, so that the potentials of the signal $S_{11}$ and $S_{12}$ become low and high, respectively, as illustrated in FIGS. 7F and 7G. As a result, the latch circuit is inverted, as illustrated in FIG. 7H, and in addition, the flip-flop 105 is inverted by the fall of the reference signal $S_1$ as illustrated in FIG. 7I. At a time $t_3'$ the D-flip-flop 105 is inverted again by the next fall of the reference signal $S_1$, so that the potential of the signal $S_{14}$ becomes low. The output signal of the D-flip-flop 105 is shifted to the D-flip-flop 106, so that at a time $t_4'$ the potential of the signal $S_{15}$ becomes low, as illustrated in FIG. 7J. At a time $t_5'$ the signal $S_2$ becomes in phase with the reference signal $S_1$, and at a time $t_6'$ the counter performs a counting operation again, as illustrated in FIGS. 7F and 7G, so that at a time $t_7'$ the latch circuit is inverted, as illustrated in FIG. 7H. As illustrated in FIG. 7I, at a time $t_8'$ the D-flip-flop 105 is inverted by the fall of the reference signal $S_1$ and, after that, as illustrated in FIG. 7J, at a time $t_9'$ the D-flip-flop 106 is inverted by the fall of the reference signal $S_1$. At a time $t_9'$, when the potential of all the signals $S_8$, $S_{13}$, $S_{14}$ and $S_{15}$ are high, the potential of the signal $S_9$ is changed from low to high, as illustrated in FIG. 7K. Here, the time T is smaller than the time $4\tau$. Thus, two or more successive out-of-phase phenomena are treated as one out-of-phase phenomenon and, therefore, the potential of the signal $S_9$ remains low from the time $t_0'$ to the time $t_9'$.

In the above-mentioned embodiment, the time $4\tau$ is dependent upon the total number of stages of the flip-flops 101, 102, 105 and 106, forming a counter and registers. Therefore, the above-mentioned time can be changed easily by changing the number of the stages of flip-flops.

As explained hereinbefore, the phase-locked loop circuit according to the present invention has the following advantages as compared with the conventional circuits.

(1) The number of external components is decreased.

(2) A direct current lock detecting signal can be stably obtained with a high speed, since the direct current detecting is obtained by performing a digital operation upon a pulse-shaped or rectangular lock detecting signal.

(3) A semiconductor device for the phase-locked loop circuit can be highly integrated, since the digital signal maintaining circuit 100, which is newly provided according to the present invention, comprises digital components, and therefore, when the circuit 100 is incorporated into the digital circuit CT''', the number of external terminals for the circuit CT''' is reduced.

(4) The low potential of the direct current lock signal is maintained for a definite time.

I claim:

1. A phase-locked loop circuit comprising:
  a reference oscillator providing a first output signal;
  a reference frequency divider, operatively connected to said reference oscillator, for dividing the frequency of the first output signal of said reference oscillator by a predetermined value and producing a second output signal having a frequency corresponding to the divided frequency of the first output signal;
  a voltage controlled oscillator providing a third output signal;
  a programmable frequency divider, operatively connected to said voltage controlled oscillator, for dividing the frequency of the third output signal by a controlled variable value to produce a fourth output signal;
  a phase comparator, operatively connected to said programmable frequency divider and said reference frequency divider, for receiving and monitoring the difference in phase between the fourth and second output signals and providing first and second phase output signals, respectively;
  a low pass filter, operatively connected between said phase comparator and said voltage controlled oscillator, for controlling said voltage controlled oscillator in dependence upon the first and second phase output signals of said phase comparator;
  lock detector means, operatively connected to said phase comparator, for generating a first lock detecting signal which is pulsed when a difference in phase is detected between said fourth and second output signals; and
  digital signal maintaining circuit means, operatively connected to said lock detector means and said reference frequency divider, for converting the first lock detecting signal into a second lock detecting signal having a direct current level, maintaining the second lock detecting signal for a predetermined time after the first lock detecting signal is extinguished and providing an output signal, said digital signal maintaining circuit means comprising:
    converter circuit means, operatively connected to said reference frequency divider and said lock detector means, for converting the first lock detecting signal into the second lock detecting signal in dependence upon the second output signal and outputting the second lock detecting signal; and
    maintaining circuit means, operatively connected to said converter circuit means, for maintaining the potential of the second lock detecting signal for the predetermined time after the first lock detecting signal is extinguished and providing the output signal.

2. A circuit as set forth in claim 1, wherein said phase-locked loop circuit comprises a semiconductor integrated circuit device.

3. A circuit as set forth in claim 1, wherein said converter circuit means comprises:
  a counter, operatively connected to said reference frequency divider and said lock detector means, for counting the second output signal of said reference frequency divider, being reset by the first lock detecting signal of said lock detector means and outputting a counter signal; and
  a latch circuit, operatively connected to said counter and said lock detector means, for receiving the first lock detecting signal and the counter signal and providing a latched output signal.

4. A circuit as set forth in claim 1, wherein said maintaining circuit means comprises register means, operatively connected to said converter circuit means and said reference frequency divider, for shifting the second lock detecting signal of said converter circuit means in dependence upon the second output signal of said reference frequency divider.

5. A circuit as set forth in claim 4, wherein said register means comprises a plurality of D-flip-flops connected in series.

6. A circuit as set forth in claim 1, wherein said digital signal maintaining circuit means further comprises gate circuit means, operatively connected to said converter circuit means and said maintaining circuit means, for receiving the second lock detecting signal from said converter circuit means and the output signal from said maintaining circuit means and providing a logical product output, accordingly.

7. A circuit as set forth in claim 6, wherein said gate circuit means is operatively connected to said lock detector means, so that said gate circuit means receives the first lock detecting signal.

8. A circuit as set forth in claim 6, wherein said gate circuit means comprises:
  a NAND gate, operatively connected to said maintaining circuit means and said lock detector means, for providing the logical product output; and
  an inverter, operatively connected to said NAND gate, for receiving and inverting the logical product output.

9. A circuit as set forth in claim 1, wherein said digital signal maintaining circuit means further comprises:
  a counter, operatively connected to said reference frequency divider and said lock detector means, for counting the second output signal of said reference frequency divider, said counter being reset by the first lock detecting signal of said lock detector means and outputting a counter signal;

a latch circuit, operatively connected to said counter and said lock detector means, for receiving the first lock detecting signal and the counter signal and providing a latched output signal;

register means, operatively connected to said latch circuit and said reference frequency divider, for shifting the latched output signal of said latch circuit in dependence upon the second output signal of said reference frequency divider; and gate circuit means, operatively connected to said lock detector means, said latch circuit and said register means.

10. A circuit as set forth in claim 3 or 9, wherein said counter comprises a plurality of binary counters connected in series.

11. A circuit as set forth in claim 10, wherein each said binary counter comprises a flip-flop.

12. A circuit as set forth in claim 3 or 9, wherein said latch circuit comprises two cross-coupled NAND gates.

* * * * *

UNITED STATES PATENT AND TRADEMARK OFFICE
CERTIFICATE OF CORRECTION

PATENT NO. : 4,437,072

DATED : March 13, 1984

INVENTOR(S) : Fumitaka Asami

It is certified that error appears in the above-identified patent and that said Letters Patent is hereby corrected as shown below:

Front page, [57] ABSTRACT, line 7, after "signal", insert --,--; delete "pulse-";

line 8, "shaped or rectangular" should be --pulsed,--;

line 11, "directed" should be --direct--.

Column 1, line 26, "bexomes" should be --becomes--;

line 40, "ratio" should be --radio--.

Column 3, line 48, "21" should be --22--.

Column 4, line 21, delete "or";

line 42, "CT'''" should be --CT"--;

line 55, "CT""  should be --CT'''--;

UNITED STATES PATENT AND TRADEMARK OFFICE
CERTIFICATE OF CORRECTION

PATENT NO. : 4,437,072  Page 2 of 2
DATED : March 13, 1984
INVENTOR(S) : Fumitaka Asami It is certified that error appears in the above-identified patent and that said Letters Patent is hereby corrected as shown below:

line 65, "fips" should be --flops--.

Column 5,    line 62, after "low", insert --,--.

Signed and Sealed this

Fourth Day of December 1984

[SEAL]

Attest:

GERALD J. MOSSINGHOFF

Attesting Officer       Commissioner of Patents and Trademarks